(12) United States Patent
Rabary et al.

(10) Patent No.: US 9,460,789 B2
(45) Date of Patent: Oct. 4, 2016

(54) NON-VOLATILE DIGITAL MEMORY INCLUDING THIN FILM RESISTORS

(71) Applicant: STMicroelectronics (Grenoble 2) SAS, Grenoble (FR)

(72) Inventors: Vincent Rabary, Champagnier (FR); Nicolas Aupetit, Voreppe (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 0 days.

(21) Appl. No.: 14/635,815

(22) Filed: Mar. 2, 2015

(65) Prior Publication Data
US 2015/0248934 A1 Sep. 3, 2015

(30) Foreign Application Priority Data
Mar. 3, 2014 (FR) ...................................... 14 51684

(51) Int. Cl.
| | | |
|---|---|---|
| G11C 11/00 | (2006.01) | |
| G11C 7/06 | (2006.01) | |
| G11C 5/14 | (2006.01) | |
| G11C 7/02 | (2006.01) | |
| G11C 8/00 | (2006.01) | |
| G11C 13/00 | (2006.01) | |
| G11C 11/56 | (2006.01) | |
| G11C 17/16 | (2006.01) | |
| G11C 17/18 | (2006.01) | |

(52) U.S. Cl.
CPC ....... *G11C 13/0069* (2013.01); *G11C 11/5664* (2013.01); *G11C 13/0002* (2013.01); *G11C 13/004* (2013.01); *G11C 13/0097* (2013.01); *G11C 17/165* (2013.01); *G11C 17/18* (2013.01); *G11C 2013/0054* (2013.01)

(58) Field of Classification Search
USPC ......... 365/148, 189.07, 189.09, 210.1, 233.1
See application file for complete search history.

(56) References Cited

U.S. PATENT DOCUMENTS

| | | | | |
|---|---|---|---|---|
| 4,839,859 | A * | 6/1989 | Moopenn | G11C 15/00 365/148 |
| 6,324,093 | B1 | 11/2001 | Perner et al. | |
| 6,675,360 | B1 | 1/2004 | Cantone et al. | |
| 6,980,465 | B2 * | 12/2005 | Taussig | G11C 5/025 365/148 |
| 2002/0008302 | A1 | 1/2002 | Singh et al. | |
| 2012/0170352 | A1 | 7/2012 | Le Neel et al. | |

* cited by examiner

*Primary Examiner* — Trong Phan
(74) *Attorney, Agent, or Firm* — Seed IP Law Group PLLC

(57) ABSTRACT

A non-volatile digital memory includes: a plurality of thin film resistors; and a control circuit adapted to: program, during a first programming phase, the thin film resistors with a plurality of bits of data by passing a current through at least one of the thin film resistors to reduce its resistance; and read, during a restoration phase, the plurality of bits of data stored by the thin film resistors by generating an electrical signal associated with each thin film resistor and comparing each electrical signal with a reference signal.

19 Claims, 2 Drawing Sheets

NON-VOLATILE DIGITAL MEMORY INCLUDING THIN FILM RESISTORS

CROSS-REFERENCE TO RELATED APPLICATION

This application claims the priority benefit of French Patent Application number 14/51684, filed on Mar. 3, 2014, the contents of which is hereby incorporated by reference in its entirety to the maximum extent allowable by law.

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable

STATEMENT REGARDING PRIOR DISCLOSURES BY THE INVENTOR OR A JOINT INVENTOR

Not Applicable

BACKGROUND

1. Field

The present disclosure relates to the field of non-volatile digital memories, and in particular to a non-volatile digital memory based on thin film resistors.

2. Description of the Related Art

It has been proposed to use fuses or anti-fuses to provide a digital memory used in circuit trimming. Circuit trimming involves adjusting one or more operating parameters of an electronic circuit after fabrication. The state of the fuses or anti-fuses for example controls a MOS transistor network, which sets the value of one or more circuit components, such as resistors or capacitors, in the circuit. Fuses or anti-fuses provide non-volatile data storage of the trimming information, the state of the fuses being permanently maintained irrespective of the presence or absence of a supply voltage to the circuit.

A drawback of such a non-volatile memory is that the fuses or anti-fuses generally require relatively high voltages and/or currents for burning them. Such voltages/currents are not compatible with the normal relatively low supply voltages of the circuit, which is problematic in the case that trimming is performed after packaging without using a dedicated test pin, and leads to difficulties in integrating such a non-volatile memory in an integrated circuit.

BRIEF SUMMARY

It is an aim of embodiments of the present disclosure to at least partially address one or more drawbacks in the prior art.

According to one aspect, there is provided a non-volatile digital memory comprising: a plurality of thin film resistors; and a control circuit adapted to: program, during a first programming phase, said thin film resistors with a plurality of bits of data by passing a current through at least one of said thin film resistors to reduce its sheet resistance; and read, during a restoration phase, the plurality of bits of data stored by the thin film resistors by generating an electrical signal associated with each thin film resistor and comparing each electrical signal with a reference signal.

According to one embodiment, the control circuit comprises a memory device adapted to store the at least one bit of data for programming each of the thin film resistors.

According to one embodiment, the memory device is further adapted to store the at least one bit of data read from each of the thin film resistors.

According to one embodiment, the control circuit further comprises an input block coupled to the memory device, the input block being adapted to store, during the first programming phase, the plurality of bits of data in the memory device, and store, during the read phase, the plurality of bits of data read from the thin film resistors in the memory device.

According to one embodiment, the control circuit comprises a plurality of transistors, each of the transistors being coupled in series with a corresponding one of the thin film resistors, wherein during the first programming phase at least one of the transistors is activated based on the plurality of data bits.

According to one embodiment, the control circuit comprises a comparator for comparing each electrical signal with the reference signal.

According to one embodiment, the at least one thin film resistor through which a current is passed has an initial sheet resistance prior to being programmed and a reduced sheet resistance after said current is passed through it, and the reference signal is generated by a reference circuit comprising a reference thin film resistor having a sheet resistance of between said initial sheet resistance and said reduced sheet resistance.

According to one embodiment, the reduced sheet resistance is between 3 and 10 percent lower than the initial sheet resistance.

According to one embodiment, the control circuit is further adapted, during a further programming phase, to: program the thin film resistors with a further plurality of bits of data by passing a current through at least one of the thin film resistors to reduce its sheet resistance to a level lower than the reduced sheet resistance; and reduce the sheet resistance of the reference thin film resistor.

According to one embodiment, the control circuit is adapted to program, during the first programming phase, at least one of the thin film resistors to reduce its sheet resistance to a first level and at least one other of the thin film resistors to reduce its sheet resistance to a second level different from said first level.

According to a further aspect, there is provided a trimming circuit of an electronic device comprising the above non-volatile digital memory, wherein the plurality of bits of data represent trimming data for setting at least one parameter of the electronic device.

According to a further aspect, there is provided an encapsulated electronic device comprising the above trimming circuit having a plurality of pads configured to receive the plurality of bits of data.

According to a further aspect, there is provided a method of non-volatile data storage comprising: programming, by a control circuit during a first programming phase, a plurality of thin film resistors with a plurality of bits of data by passing a current through at least one of said thin film resistors to reduce its sheet resistance; and reading, during a restoration phase, the plurality of bits of data stored by the thin films resistors by generating an electrical signal associated with each thin film resistor and comparing each electrical signal with a reference signal.

According to one embodiment, the at least one thin film resistor through which a current is passed has an initial sheet resistance prior to being programmed and a reduced sheet resistance after said current is passed through it, the method further comprising generating the reference signal by a reference circuit comprising a reference thin film resistor having a sheet resistance of between the initial sheet resistance and the reduced sheet resistance.

According to one embodiment, the method further comprises: programming, during a further programming phase, the thin film resistors with a further plurality of bits of data by passing a current through at least one of the thin film resistors to reduce its sheet resistance to a level lower than the reduced sheet resistance; and reducing the sheet resistance of the reference thin film resistor.

BRIEF DESCRIPTION OF THE SEVERAL VIEWS OF THE DRAWINGS

The foregoing and other features and advantages will become apparent from the following detailed description of embodiments, given by way of illustration and not limitation with reference to the accompanying drawings, in which.

DETAILED DESCRIPTION

While throughout the following description a digital non-volatile memory is described in the context of a circuit trimming application, it will be apparent to those skilled in the art that such a memory could have various other applications. For example, such a memory is well adapted to applications in which it is desired that a non-volatile memory can be programmed once or a few times using a relatively low supply voltage.

Figure 1:
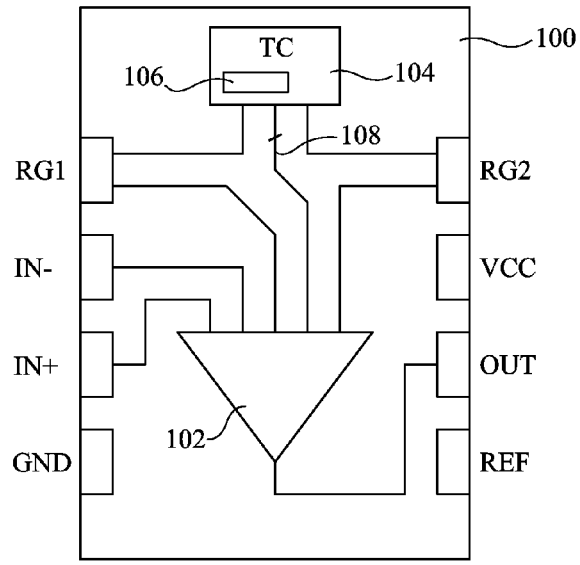
FIG. 1 schematically illustrates an integrated circuit according to an example embodiment of the present disclosure.

FIG. 1 schematically illustrates an integrated circuit 100, which in this example comprises an operational amplifier 102. The integrated circuit 100 has for example 8 input/output pads, of which there are: a pair of pads IN− and IN+ for receiving differential input signals; a pad VCC for receiving a supply voltage; a pad GND for receiving a ground voltage; a pad OUT for providing an output signal; a pad REF for providing a reference voltage to the circuit during normal operation; and input pads RG1, RG2, which provide input pins of three Op Amp instrumentation amplifiers.

The integrated circuit 100 further comprises a trimming circuit (TC) 104, which is for example coupled to the input pads RG1 and RG2. The trimming circuit 104 includes a digital non-volatile memory 106 storing bits of trimming data, which are provided on output lines 108 to the operational amplifying 102. One or more operating parameters of the operational amplifier 102 are trimmed based on the trimming data each time the operational amplifier is powered up.

Of course, the operational amplifier in FIG. 1 is merely one example. In alternative embodiments the trimming circuit could be used to trim one of a wide range of different circuits.

Figure 2:
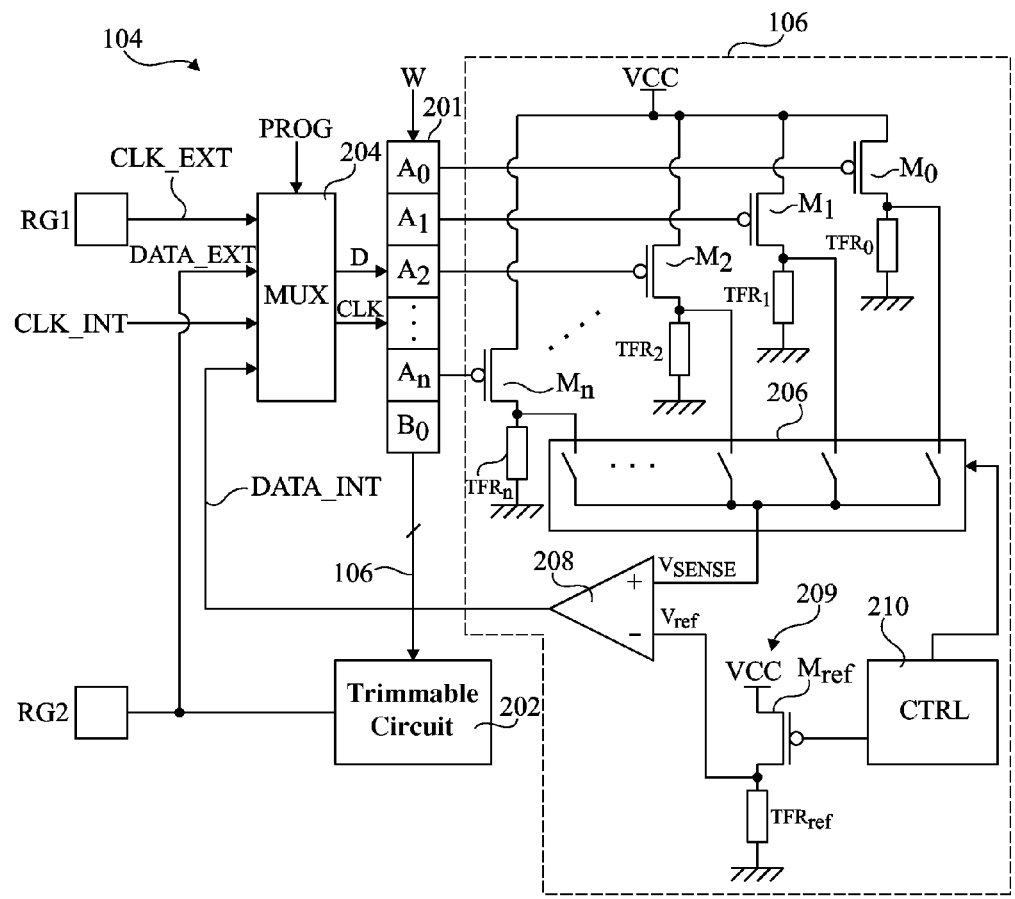
FIG. 2 schematically illustrates a trimming circuit comprising a non-volatile digital memory according to an example embodiment of the present disclosure.

FIG. 2 illustrates the trimming circuit 104 of FIG. 1 in more detail according to an example embodiment.

As illustrated, the digital non-volatile memory 106 is formed of an array of thin film resistors $TFR_0$ to $TFR_n$. There are n+1 such resistors, where n is for example an integer equal or greater than 1. The thin film resistors are each for example formed of a layer of polysilicon having a thickness of between 30 and 50 nm. As will be described in more detail below, these resistors have a sheet resistance that is modified by a current passed through them. In particular, each resistor for example has an initial sheet resistance of between 1 and 10 kΩ, and the initial sheet resistance is for example reduced by between 3 and 10 percent by the application of a current in the range of 1 and 1.5 mA per μm. For example, the thin film resistors correspond to those described in the US patent application published as US2002/0008302, and are for example formed using the process described in paragraph [0027] of that published application, which is incorporated herein by reference in its entirety.

To permit a trimming phase during device test, each of the thin film resistors $TFR_0$ to $TFR_n$ is for example coupled in series with a corresponding transistor $M_0$ to $M_n$ between the supply voltage VCC and ground. In the example of FIG. 2, the transistors $M_0$ to $M_n$ are PMOS transistors, and they are controlled based on data stored in a register 201. In particular, the register 201 for example stores n+1 bits of data $A_0$ to $A_n$, which respectively control the gates of the n+1 transistors $M_0$ to $M_n$. As will be described in more detail below, the register 201 may also store further control data, such as a bit $B_0$. The data stored by the register 201 is provided on lines 106 to an electronic circuit 202 that is to be trimmed (trimmable circuit), which is for example the operational amplifier 102 of FIG. 1, or another circuit.

The data of the register 201 is supplied by an input multiplexer 204, which receives an external data signal DATA_EXT and internal data signal DATA_INT. The input multiplexer 204 also for example receives an external clock signal CLK_EXT and an internal clock signal CLK_INT. The external data DATA_EXT for example comes from the RG2 input pad of FIG. 1, while the external clock EXT_CLK for example comes from the RG1 input pad of FIG. 1, although in alternative embodiments, other input pads could be used. The input multiplexer 204 is for example controlled by a programming signal PROG, which indicates whether a programming phase or a read phase of the digital memory is to be implemented.

A node between each resistor $TFR_0$ to $TFR_n$ and the corresponding transistor $M_0$ to $M_n$ is for example coupled to a corresponding input of a multiplexer 206, which selects one of these inputs to be provided at its output. The output of multiplexer 206 provides a voltage signal $V_{sense}$ to one input of a comparator 208, which compares this signal with a reference voltage $V_{ref}$. In the example of FIG. 2, the reference voltage $V_{ref}$ is provided by a reference memory cell 209 comprising a thin film resistor $TFR_{ref}$ coupled in series with a transistor $M_{ref}$ between the supply voltage VCC and ground. The transistor $M_{ref}$ and the multiplexer 206 are for example controlled by a control circuit (CTRL) 210.

Operation of the trimming circuit 104 of FIG. 2 will now be described in more detail with reference to the flow diagram of FIG. 3.

Figure 3:
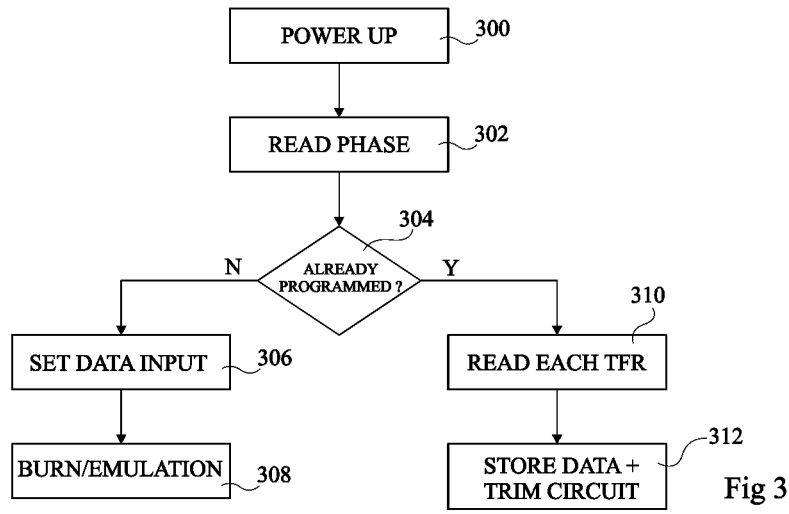
FIG. 3 is a flow diagram illustrating steps in a method of trimming a circuit according to an example embodiment of the present disclosure.

In a first operation 300 of FIG. 3, the device is powered up, for example meaning that the VCC voltage is applied to the circuit, for example via the pad VCC of FIG. 1.

In a subsequent operation 302, a read phase occurs, in which an element is read to determine whether or not the digital non-volatile memory has already been programmed. This information is for example determined by reading the sheet resistance of one of the thin film resistors of the digital non-volatile memory, such as the resistor $TFR_0$, which is for example set to have a reduced sheet resistance the first time the memory is programmed.

In a subsequent operation 304, it is determined whether, based on the read operation, the memory device has already been programmed. If not, the next operation is 306.

In operation 306, the programming signal PROG to multiplexer 204 is asserted, which causes the external data input signal DATA_EXT to be provided to the register 201 as data D. Trimming data is then loaded into the register serially. For example, the register 201 operates on a first-in first-out (FIFO) basis. The PROG signal also for example causes the external clock signal CLK_EXT to be selected and provided as a clock signal CLK to the register 201 for clocking the data.

In a subsequent operation 308, a programming or emulation phase occurs. The selection between programming and emulation is for example determined by one bit, such as the bit $B_0$, stored in the register 201. If this bit is low, an emulation phase is for example entered, in which the trimming data values $A_0$ to $A_n$ from the register 201 are provided to the circuit 202, but these values are not yet burnt to the thin film resistors $TFR_0$ to $TFR_n$. This allows the trimming data to be adjusted until a desired circuit behavior is achieved for the electronic circuit 202.

Alternatively, if the bit $B_0$ is high, a write signal W is for example asserted at the input of the register 201, and a programming phase is for example entered, in which the transistors $M_0$ to $M_n$ are controlled based on the corresponding data bits $A_0$ to $A_n$ stored in the register 201. For example, each bit at a low value causes the corresponding transistor to be activated, such that a programming current flows from the supply voltage VCC through the corresponding thin film resistor. The supply voltage VCC is for example applied in the form of a pulse having a duration of between 2 and 10 ms. The supply voltage VCC is for example set to a higher level than its standard value, for example to a voltage of between 5.5 and 6 V. In one example, each resistor has an initial sheet resistance of between 1 and 10 kΩ, and the programming current causes a reduction in the sheet resistance of the corresponding resistors by between 3 and 10 percent of the initial sheet resistance. During this programming phase, all of the resistors are for example programmed at the same time.

As mentioned above, the resistor $TFR_0$ is for example used to indicate whether or not the digital memory has already been programmed. Operation 308 also for example involves, during the programming phase, programming resistor $TFR_0$ by reducing its sheet resistance.

If in operation 304 of FIG. 3 it is determined that the digital non-volatile memory has already been programmed, the subsequent operation is 310.

In operation 310, a restoration phase occurs in which the trimming data stored in the digital non-volatile memory 106 is read by detecting the sheet resistance of each thin film resistor, except for example the resistor $TFR_0$, if this has already been read to detect that the device has already been programmed. Each of the other transistors $M_1$ to $M_n$ is then for example activated in turn, to pass a read current through it, and generate a voltage across the corresponding thin film resistor that is proportional to its sheet resistance. The selection of the transistors is for example performed by providing a biasing transistor (not illustrated in FIG. 3) coupled between the gate of each transistor $M_0$ to $M_n$ and ground, these biasing transistors being activated in turn so that the transistor $M_0$ to $M_n$ are also activated in turn. For generating the read current, a lower supply voltage level VCC than the one used for programming is for example applied. For example a value of between 2 and 5.5 V is used, for example corresponding to the circuits normal supply voltage. The multiplexer 206 is then used to provide the generated voltage signals to the comparator 208, which compares each voltage level with a reference voltage $V_{ref}$ in order to determine whether the resistor still has its initial sheet resistance or a reduced sheet resistance. The output of the comparator 208 provides the internal data signal DATA_INT.

For example, assuming that the initial sheet resistance of each resistor $TFR_0$ to $TFR_n$ is $R_i$ Ω, and that the reduction in sheet resistance caused by the programming step is equal to 2X Ω, voltage $V_{ref}$ for example corresponds to a sheet resistance value of between $R_i$ and $R_i$-2X for example equal to or around $R_i$-X, where X is a unit value of sheet resistance reduction that depends on the materials of the resistors and the programming current applied to the resistance as discussed below.

In a subsequent step (labeled store data+trim circuit in FIG. 3) 312 of FIG. 3, the input multiplexer 204 is controlled by the programming signal PROG to select the internal data signal DATA_INT and for example the internal clock signal CLK_INT to be provided to the register 201. The data read from the digital memory is thus loaded as the new values $A_1$ to $A_n$ in the register 201 and provided to the circuit 102 to be trimmed via the lines 106.

While not illustrated in FIG. 3, in some embodiments, a latch may be provided between the register 201 and the circuit device 202, the latch being configured to store the trimming data when it is to be applied to the circuit 202.

Figure 4:
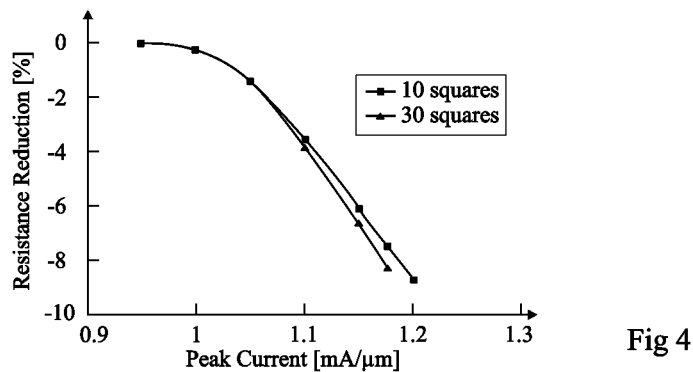
FIG. 4 is a graph illustrating an example of reductions in sheet resistance of thin film resistors for a range of programming currents applied through the resistors.

FIG. 4 is a graph representing examples of the permanent sheet resistance reduction of a thin film resistor when a current of between 0.95 and 1.2 mA/μm is applied through it. The X-axis of the graph represents Peak Current [mA/μm] and includes values 0.9, 1, 1.1, 1.2, and 1.3. The Y-axis of the graph represents Sheet resistance Reduction [%] and includes values 0, −2, −4, −6, −8, and −10, which represent percentages of the initial sheet resistance of the thin film resistor. The curve with square points shows an example in which the thin film resistor corresponds to a 10-square form (labeled store data+trim circuit in FIG. 3), in other words having a length ten time greater than its width. The curve with triangular points shows an example in which the thin film resistor corresponds to a 30-square form (labelled 30 squares in FIG. 4), in other words having a sheet resistance three times greater than the 10-square form resistor. It can be seen that the sheet resistance reduction phenomenon is very similar irrespective of the form and sheet resistance of the thin film resistor for a given current per µm. In particular, in the example of FIG. 4, in both types of resistors the sheet resistance reduction is approximately 8 percent for a current of 1.2 mA/µm. The reduction in sheet resistance will to some extent be determined by physical properties of the thin film resistor, such as the thickness of the thin film, for example formed of polysilicon, and the sheet resistance of the underlying oxide layer.

The flow diagram of FIG. 3 corresponds to an example in which a single programming phase is performed. In other words, the digital non-volatile memory is one-time programmable. In alternative embodiments, the memory is reprogrammable a few times by using a reset operation, as will now be described with reference to FIG. 5.

Figure 5:
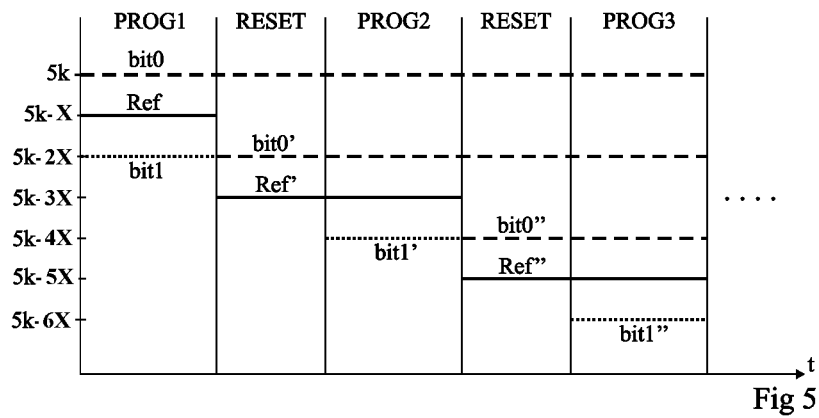
FIG. 5 is a timing diagram illustrating an example of multiple programming phases of a digital non-volatile memory according to an example embodiment of the present disclosure.

FIG. 5 is a timing diagram showing an example of a sequence of programming and reset operations of a digital non-volatile memory. FIG. 5 includes the programming phases PROG1, RESET, PROG2, RESET, and PROG3; resistor values 5 k (meaning 5 kΩ), 5 k-X, 5 k-2X, 5 k-3X, 5 k-4X, 5 k-5X, 5 k-6X, Ref, Ref', and Ref"; and logic values bit0, bit1, bit0', bit1', bit0", and bit". In the example of FIG. 5, it is assumed that each of the thin film resistors has an initial sheet resistance of around 5 kΩ, and that the programming phase causes a sheet resistance reduction of 2X for those resistors that have a programming current passed through them. Thus during a first programming phase, a bit 0 logic value for example corresponds to the initial sheet resistance of 5 kΩ, a bit 1 logic value corresponds to the reduced sheet resistance of 5 k-2X Ω and a reference sheet resistance of around 5 k-X Ω is for example used. The reference sheet resistance is for example created from a reference resistor of the same initial sheet resistance as the other resistors of the memory, which is then programmed with a reduced programming current to bring about a smaller reduction in sheet resistance. For example, with reference to the graph of FIG. 4, in one example a programming current of 1.2 mA/µm could be used for the main thin film resistors of the memory to cause a sheet resistance reduction of around 8 percent, and a programming current of around 1.1 mA/µm could be used for the reference resistor to cause a sheet resistance reduction of around 4 percent. Referring again to FIG. 4 and assuming an initial sheet resistance of 5 kΩ, using the programming current of around 1.2 mA/µm produces a sheet resistance reduction 2X of 0.4Ω (8% times 5 kΩ) and using the programming current of around 1.1 mA/µm produces a sheet resistance reduction 2X of 0.2Ω (4% times 5 kΩ). For example, to achieve the reduced programming current, the transistor $M_{ref}$ associated with the reference resistor is controlled at its gate by a voltage level closer to its threshold voltage than the voltage level applied to the resistors $M_1$ to $M_n$ associated with the other resistors $TFR_0$ to $TFR_n$.

When the memory is to be reprogrammed, a reset phase is performed, in which the sheet resistance of the reference resistor is reduced to a value of 5 k-3X Ω, and a bit 0' logic value is now assumed to equal between 5 k and 5 k-2X Ω. A bit 1' logic value is represented by a sheet resistance of 5 k-4X Ω, which corresponds to the initial sheet resistance reduced twice by the programming current. Thus any thin film resistor that already had its sheet resistance reduced in the first programming phase can have its sheet resistance reduced again by a single programming pulse, whereas any thin film resistor that did not have its sheet resistance reduced during the first programming phase can have its sheet resistance reduced by two programming pulses to bring it down to 5 k-4X Ω. Alternatively, the voltage level of VCC can be increased to provide an increased current to the resistor and bring its sheet resistance straight down to 5 k-4X Ω using a single current pulse.

Further reset and programming phases can be performed in a similar manner. The number of times that the memory can be reprogrammed is dependent only on the precision of the comparator used to distinguish the logic bit 0 from the logic bit 1. Indeed, the difference between the electrical signals generated by the thin film resistors of the memory and the reference resistor will be reduced on each reprogramming operation.

In the case of a digital memory reprogrammable multiple times, instead of using the thin film resistor $TFR_0$ to indicate when the device has already been programmed, a plurality of resistors can be used to store this information and prevent the memory being reprogrammed more than a certain number of times. Furthermore, to permit the digital memory to be reprogrammed, a specific code can be supplied to the input pad used for the trimming data, such as the pad RG2 of FIG. 1, to indicate that a programming phase is to be entered, rather than a read phase of the current state of the memory.

While in FIG. 5 different degrees of sheet resistance reduction are used to permit the memory to be reprogrammed multiple times, it would also be possible to program each thin film resistor during a single programming phase to have one of multiple sheet resistance levels, to program more than one bit of data using a single thin film resistor. For example, each thin film resistor could be programmed to have either its initial sheet resistance $R_i$ to program bits "00", or one of three degrees of reduced sheet resistances equal to $R_i$-2X to program "01" $R_i$-4X to program "10" or $R_i$-6X to program "11". These levels can for example be achieved by applying zero, one, two or three programming pulses to each thin film resistor. Three comparators can be used to detect these four programmed states. For example, a first comparator is associated with a reference resistor having a sheet resistance of between $R_i$-2X and $R_i$-4X, for example of $R_i$-3X. If the thin film resistor has a higher sheet resistance a second comparator associated with a reference sheet resistance of between $R_i$ and $R_i$-2X, for example of $R_i$-X, can be used to distinguish between the sheet resistance states of $R_i$ and $R_i$-2X. Alternatively, if the first comparator determines that the thin film resistor has a lower sheet resistance than $R_i$-3X, a third comparator associated with a reference sheet resistance of between $R_i$-4X and $R_i$-6X, for example of $R_i$-5X, can be used to distinguish between the resistive states of $R_i$-4X and $R_i$-6X. In alternative embodiments, rather than there being four sheet resistance levels, each thin film resistor could be programmed to have one of a different number of sheet resistance levels, for example 3 or more, in order to program a different number of bits using each resistor. A different number of comparators could then be used during the read phase to detect the programmed sheet resistance level of each thin film resistor.

An advantage of the embodiments described herein is that a digital non-volatile memory can be implemented having a relatively low surface area and benefitting from relatively low programming voltages than are compatible with standard CMOS technology.

Having thus described at least one illustrative embodiment, various alterations, modifications and improvements will readily occur to those skilled in the art.

For example, while a specific circuit implementing the digital memory 106 in FIG. 2 has been described, it will be apparent to those skilled the art that alternative circuit configurations would be possible. In some embodiments, during the read phase of the digital memory, rather than generating an electrical signal in the form of a voltage signal $V_{sense}$, a current signal could be generated and compared by a current comparator to a current flowing through a reference cell.

Furthermore, it will be apparent to those skilled in the art that, in any of the embodiments described herein, all of the PMOS transistors could be replaced by NMOS transistors and vice versa. Furthermore, while transistors based on MOS technology are described, in alternative embodiments other transistor technologies could be used, such as bipolar technology.

Furthermore, it will be apparent to those skilled in the art that the various features described in relation to the various embodiments could be combined, in alternative embodiments, in any combination.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A non-volatile digital memory comprising:
   a plurality of thin film resistors;
   a control circuit adapted to:
      program, during a first programming phase, said thin film resistors with a plurality of bits of data by passing a current through at least one of said thin film resistors and reducing a resistance of the at least one of said thin film resistors; and
      read, during a restoration phase, the plurality of bits of data stored by the thin film resistors by generating electrical signals associated respectively with the thin film resistors and comparing each electrical signal with a reference signal; and
   a reference circuit configured to generate the reference signal, the reference circuit including a reference thin film resistor having a resistance between an initial resistance of the at least one thin film resistor and a reduced resistance of the at least one thin film resistor after being programmed, wherein the control circuit is further adapted, during a second programming phase, to:
      program said thin film resistors with a further plurality of bits of data by passing a current through the at least one of the thin film resistors to reduce its resistance to a level lower than said reduced resistance; and
      reduce the resistance of the reference thin film resistor.

2. The non-volatile digital memory of claim 1, wherein said control circuit comprises a memory device adapted to store said at least one bit of data for programming said thin film resistors.

3. The non-volatile digital memory of claim 2, wherein said memory device is further adapted to store the plurality of bits of data read from the thin film resistors.

4. The non-volatile digital memory of claim 3, wherein said control circuit further comprises an input block coupled to said memory device, the input block being adapted to store in said memory device, during the first programming phase, the plurality of bits of data, and store in said memory device, during the read phase, the plurality of bits of data read from the thin film resistors.

5. The non-volatile digital memory of claim 1, wherein the control circuit comprises a plurality of transistors, each of said transistors being coupled in series with a corresponding one of the thin film resistors, wherein during the first programming phase at least one of the transistors is activated based on the plurality of data bits.

6. The non-volatile digital memory of claim 1, wherein the control circuit comprises a comparator configured to compare each electrical signal with the reference signal.

7. The non-volatile digital memory of claim 1, wherein said reduced resistance is between 3 and 10 percent lower than said initial resistance.

8. The non-volatile digital memory of claim 1, wherein said control circuit is adapted to program, during said first programming phase, the at least one of said thin film resistors to reduce its resistance to a first level and at least one other of said thin film resistors to reduce a resistance of the at least one other of said thin film resistors to a second level different from said first level.

9. A trimming circuit of an electronic device, the trimming circuit comprising:
   a non-volatile digital memory that includes:
      a plurality of thin film resistors;
      a control circuit adapted to:
         program, during a first programming phase, said thin film resistors with a plurality of bits of data by passing a current through at least one of said thin film resistors and reducing a resistance of the at least one of said thin film resistors; and
         read, during a restoration phase, the plurality of bits of data stored by the thin film resistors by generating electrical signals associated respectively with the thin film resistors and comparing each electrical signal with a reference signal, wherein the plurality of bits of data represent trimming data for setting at least one parameter of said electronic device; and
      a reference circuit configured to generate the reference signal, the reference circuit including a reference thin film resistor having a resistance between an initial resistance of the at least one thin film resistor and a reduced resistance of the at least one thin film resistor after being programmed, wherein the control circuit is further adapted, during a second programming phase, to:
         program said thin film resistors with a further plurality of bits of data by passing a current through the at least one of the thin film resistors to reduce its resistance to a level lower than said reduced resistance; and
         reduce the resistance of the reference thin film resistor.

10. The trimming circuit of claim 9, wherein said control circuit comprises a memory device adapted to store said at least one bit of data for programming said thin film resistors and store the plurality of bits of data read from the thin film resistors.

11. The trimming circuit of claim 9, wherein said control circuit further comprises an input block coupled to said memory device, the input block being adapted to store in said memory device, during the first programming phase, the plurality of bits of data, and store in said memory device, during the read phase, the plurality of bits of data read from the thin film resistors.

12. The trimming circuit of claim 9, wherein said control circuit is adapted to program, during said first programming phase, the at least one of said thin film resistors to reduce its resistance to a first level and at least one other of said thin film resistors to reduce a resistance of the at least one other of said thin film resistors to a second level different from said first level.

13. An encapsulated electronic device comprising:
a plurality of pads configured to receive a plurality of bits of data; and
a trimming circuit coupled to the pads and including a non-volatile digital memory that includes:
a plurality of thin film resistors;
a control circuit adapted to:
program, during a first programming phase, said thin film resistors with the plurality of bits of data by passing a current through at least one of said thin film resistors and reducing a resistance of the at least one of said thin film resistors; and
read, during a restoration phase, the plurality of bits of data stored by the thin film resistors by generating electrical signals associated respectively with the thin film resistors and comparing each electrical signal with a reference signal, wherein the plurality of bits of data represent trimming data for setting at least one parameter of said electronic device; and
a reference circuit configured to generate the reference signal, the reference circuit including a reference thin film resistor having a resistance between an initial resistance of the at least one thin film resistor and a reduced resistance of the at least one thin film resistor after being programmed, wherein the control circuit is further adapted, during a second programming phase, to:
program said thin film resistors with a further plurality of bits of data by passing a current through the at least one of the thin film resistors to reduce its resistance to a level lower than said reduced resistance; and
reduce the resistance of the reference thin film resistor.

14. The encapsulated electronic device of claim 13, wherein said control circuit comprises a memory device adapted to store said at least one bit of data for programming said thin film resistors and store the plurality of bits of data read from the thin film resistors.

15. The encapsulated electronic device of claim 13, wherein said control circuit further comprises an input block coupled to said memory device, the input block being adapted to store in said memory device, during the first programming phase, the plurality of bits of data, and store in said memory device, during the read phase, the plurality of bits of data read from the thin film resistors.

16. The encapsulated electronic device of claim 13, wherein said control circuit is adapted to program, during said first programming phase, the at least one of said thin film resistors to reduce its resistance to a first level and at least one other of said thin film resistors to reduce a resistance of the at least one other of said thin film resistors to a second level different from said first level.

17. A method of non-volatile data storage comprising:
programming, by a control circuit during a first programming phase, a plurality of thin film resistors with a plurality of bits of data by passing a current through at least one of said thin film resistors and reducing a resistance of the at least one of said thin film resistors;
reading, during a restoration phase, the plurality of bits of data stored by the thin films resistors by generating electrical signals respectively associated with the thin film resistors and comparing each electrical signal with a reference signal, wherein the at least one thin film resistor through which a current is passed has an initial resistance prior to being programmed and a reduced resistance after being programmed;
generating the reference signal by a reference circuit including a reference thin film resistor having a resistance between said initial resistance and said reduced resistance;
programming, during a second programming phase, the thin film resistors with a further plurality of bits of data by passing a current through the at least one of said thin film resistors to reduce the resistance of the at least one of said thin film resistors to a level lower than said reduced resistance; and
reducing the resistance of the reference thin film resistor.

18. The method of claim 17, comprising storing, in a memory of the control circuit, said at least one bit of data for programming said thin film resistors.

19. The method of claim 17, comprising storing, in the memory of the control circuit, the plurality of bits of data read from the thin film resistors.

* * * * *